United States Patent
Wu

(10) Patent No.: US 7,795,924 B2
(45) Date of Patent: Sep. 14, 2010

(54) PHASE DETECTING MODULE AND DETECTING METHOD THEREOF

(75) Inventor: Shan Tsung Wu, Taipei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 12/420,491

(22) Filed: Apr. 8, 2009

(65) Prior Publication Data

US 2009/0256595 A1 Oct. 15, 2009

(30) Foreign Application Priority Data

Apr. 9, 2008 (TW) .............................. 97112848 A

(51) Int. Cl.
*H03L 7/085* (2006.01)
(52) U.S. Cl. .................. 327/2; 375/373; 324/76.52; 324/76.77
(58) Field of Classification Search ............... 327/2–12, 327/141, 144–163; 375/373–376; 324/76.52–76.54, 324/76.66, 76.77, 76.78; 331/25
See application file for complete search history.

(56) References Cited

U.S. PATENT DOCUMENTS

| 4,144,489 A | * | 3/1979 | Ward et al. ................ 324/76.62 |
| 5,663,992 A | * | 9/1997 | Farmer ....................... 375/376 |
| 6,940,933 B1 | * | 9/2005 | Heinonen et al. ........... 375/354 |

* cited by examiner

*Primary Examiner*—Lincoln Donovan
*Assistant Examiner*—Patrick O'Neill
(74) *Attorney, Agent, or Firm*—WPAT, PC; Justin King

(57) ABSTRACT

A phase detecting module capable of optimizing detection accuracy and noise robustness, and a detecting method, are included. The phase detecting module includes a phase detecting circuit, an energy estimating circuit and a selecting circuit. The phase detecting circuit detects a phase of an input signal to generate a phase detection value. The energy estimating circuit estimates energy of the input signal to generate an energy estimation value. The selecting circuit selectively outputs the phase detection value according to the energy estimation value.

17 Claims, 7 Drawing Sheets

PHASE DETECTING MODULE AND DETECTING METHOD THEREOF

CROSS REFERENCE TO RELATED PATENT APPLICATION

This patent application is based on a Taiwan, R.O.C. patent application No. 097112848 filed on Apr. 9, 2008.

FIELD OF THE INVENTION

The present invention relates to a phase detecting module and a detecting method thereof, and more particularly, to a phase detecting module capable of optimizing detection accuracy and noise robustness, and a detecting method thereof.

BACKGROUND OF THE INVENTION

As demands for sophisticated system clocks grow, phase-locked loops (PLLs) gradually prevail as a crucial component for generating multiple clocks. Referring to FIG. 1, a PLL 110 generally comprises a phase detector 112, a low-pass filter 114, an amplifier 116 and a voltage-controlled oscillator (VCO) 118. The phase detector 112 receives an input signal Vi and an output signal Vo from the VCO 118, and outputs a pulse signal Vd corresponding to a phase difference between the input signal Vi and the output signal Vo. The pulse signal Vd passes through the low-pass filter 114 to remove its high frequency components and to keep its low frequency components, and is then amplified by the amplifier 116 to control the VCO 118, such that a frequency of the output signal Vo steadily approaches a frequency of the input signal Vi. When the phase difference between the two signals stays constant, the frequency of the output signal Vo from the VCO 118 equals to that of the input signal Vi.

During the frequency-locking process, instead of staying constant, a bandwidth of the low-pass filter 114 gradually reduces as being controlled by a phase lock indicator 120. The phase lock indicator 120 first estimates the phase difference between the input signal Vi and the output signal Vo, and averages a plurality of estimated phase differences after a period of time to obtain an averaged phase difference value. According to the average value, the phase lock indicator 120 determines whether the PLL 110 is locked to the frequency of the input signal Vi. When it is determined that the PLL 110 is locked to the frequency of the input value Vi, the phase lock indicator 120 controls the low-pass filter 114 to reduce the bandwidth in order to maintain a current locked status. Under such circumstances, the PLL 110 is facilitated to more accurately lock to the frequency.

The phase lock indicator 120 simply calculates the average value of a plurality of phase differences to serve as basis for whether to change the bandwidth of the low-pass filter. However, the simple mechanism of calculating the average value is not adapted for all communication systems. To take cross-quadrature amplitude modulation (QAM) for example, it is known to those skilled in the related art that, as closer as a modulated signal gets to the center of the constellation, the smaller a signal-to-noise ratio the modulated signal has, and is more likely to be interfered with noise. It is to be noted that the cross-QAM is not applied to modulated signals located at corners of the constellation (shown as dotted points) but only to modulated signals located within the cross (shown as solid points). As a result, the input signal of the PLL 110 is highly prone to severe noise interference to lead to critical errors in the average value calculated by the phase lock indicator 120. Therefore, an overall performance of the PLL 110 gets rather unsatisfactory due to inaccurate determination of the PLL 110 based on the erroneous average value.

SUMMARY OF THE INVENTION

Therefore, to solve the foregoing issue, an objective of the present invention is to provide a phase detecting module and a detecting method thereof, which are capable of optimizing detection accuracy and noise robustness.

A phase detecting module according to one embodiment of the invention comprises a phase detecting circuit, an energy estimating circuit and a selecting circuit. The phase detecting circuit detects a phase of an input signal to generate a phase detection value. The energy estimating circuit estimates energy of the input signal to generate an energy estimation value. The selecting circuit selectively outputs the phase detection value according to the energy estimation value.

A phase detecting module according to another embodiment of the invention comprises a phase detecting circuit, an energy estimating circuit and an adjusting circuit. The phase detecting circuit detects a phase of an input signal to generate a phase detection value. The energy estimating circuit estimates energy of the input signal to generate an energy estimation value. The adjusting circuit determines a weight value and adjusts the phase detection value according to the weight value.

A phase detecting method according to one embodiment of the invention comprises steps of detecting a phase of an input signal to generate a phase detection value, estimating energy of the input signal to generate an energy estimation value, and selectively outputting the phase detection value according to the energy estimation value.

A phase detecting method according to another embodiment of the invention comprises steps of detecting a phase of an input signal to generate a phase detection value, estimating energy of the input signal to generate an energy estimation value, and determining a weight value according to the energy estimation value and adjusting the phase detection value according to the weight value.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

In the view of the foregoing drawbacks of the prior art, the invention provides a phase detecting module that selectively keeps or discards a phase detection value of an input signal according to the energy of the input signal. Therefore, a phase detection value of an input signal having a lower energy, namely, a signal easily affected by noises, is not selected to serve as determination basis for a phase lock indicator. In another embodiment, the phase detecting module of the invention multiplies the phase detection value of the input signal according to the energy of the input signal with a weight value. Therefore, according to this embodiment, phase detection values with larger errors due to noise interference are not entirely discarded, but involve a lowered weight during a determination process of the PLL. The two embodiments described and combinations thereof are capable of effectively optimizing determination accuracy and noise robustness of the phase lock indicator, and are favorable for maximizing an overall performance of the PLL as well as being suitable for all communication systems.

Figure 1:
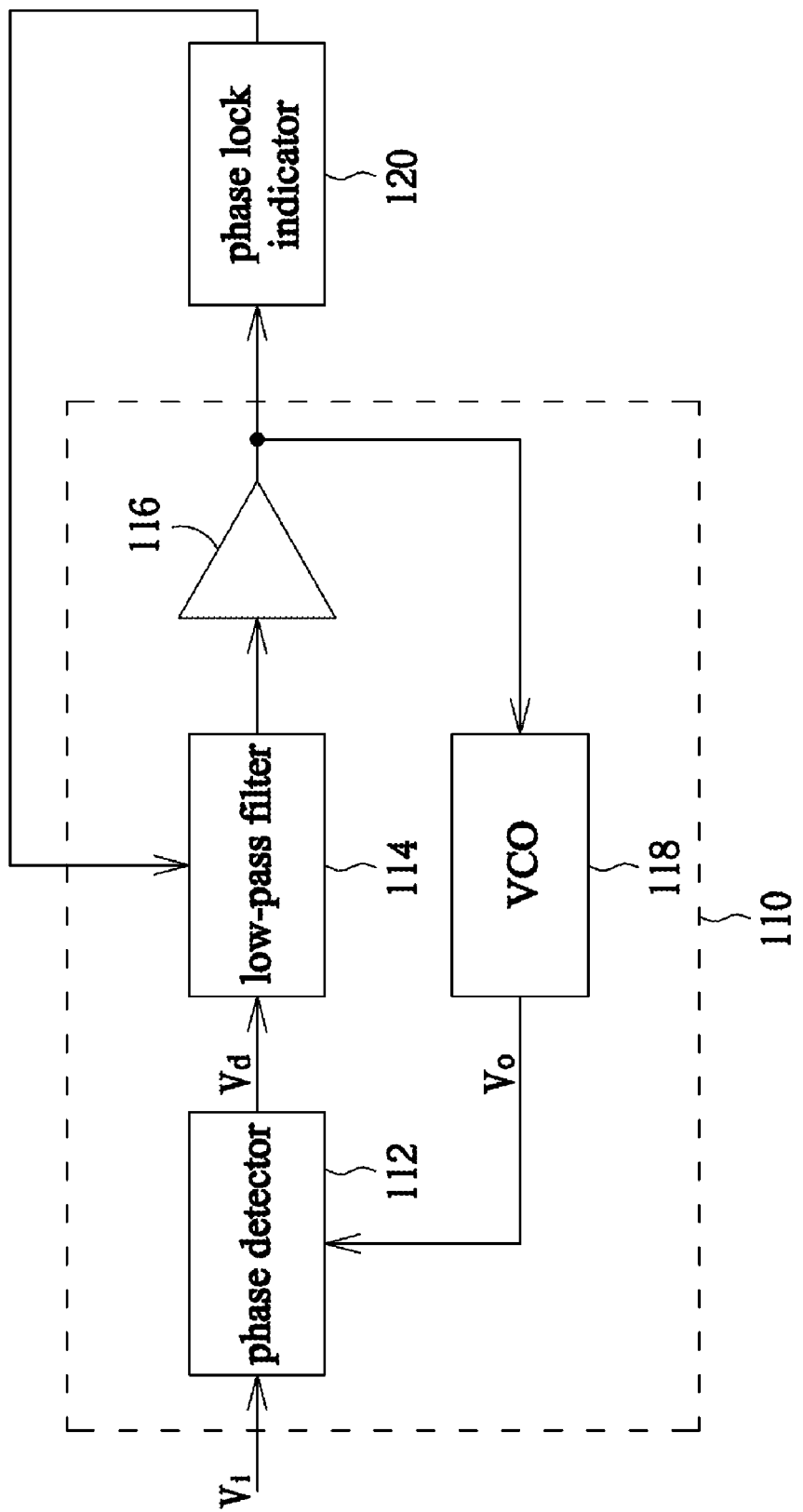
FIG. 1 is a block diagram of a phase-locked loop (PLL) and a phase lock indicator according to the prior art.
Figure 2:
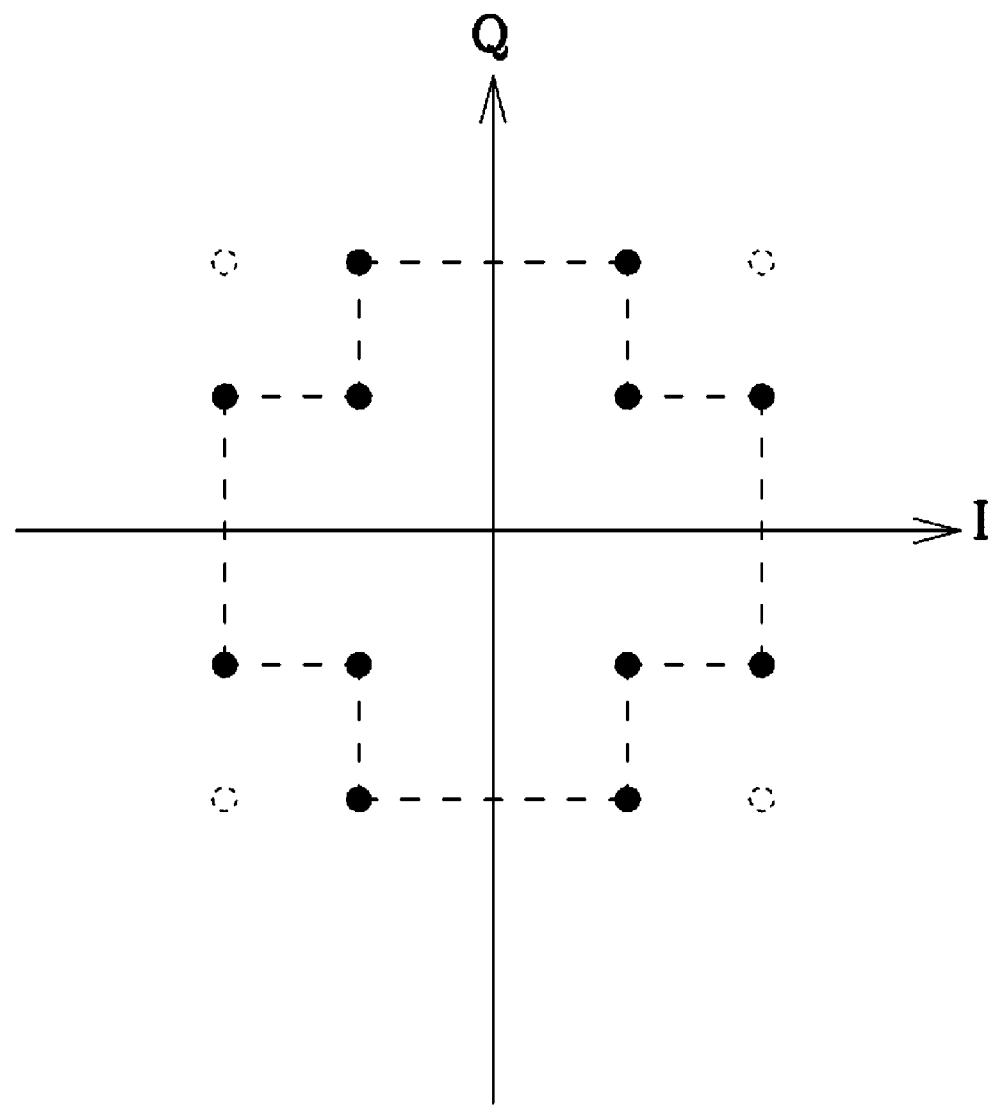
FIG. 2 is a constellation diagram of conventional cross-quadrature amplitude modulation (QAM).
Figure 3:
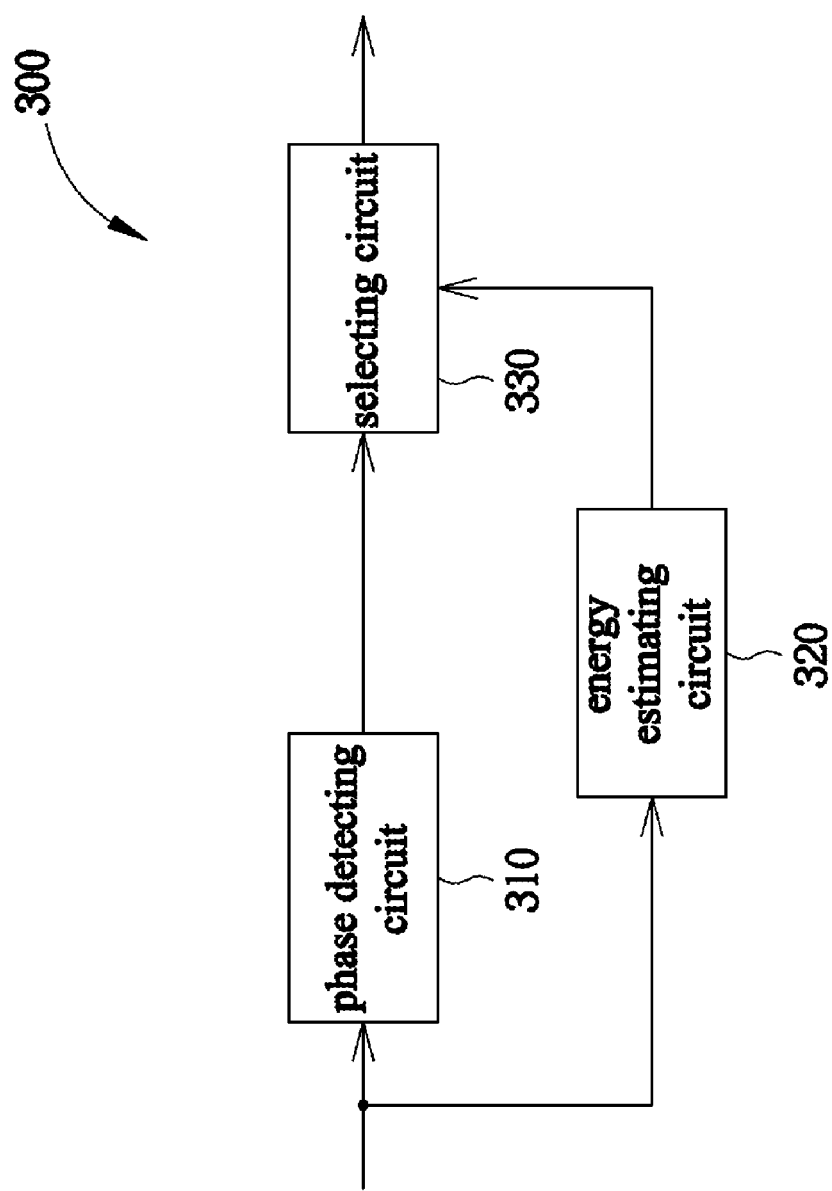
FIG. 3 is a block diagram of a phase detecting module according to one embodiment of the invention.

FIG. 3 shows a block diagram of a phase detecting module according to one embodiment of the invention. A phase detecting module 300 comprises a phase detecting circuit 310, an energy estimating circuit 320 and a selecting circuit 330. When an input signal is input into the phase detecting module 300, the phase detecting circuit 310 and the energy estimating circuit 320 detect the phase and energy of the input signal at a detecting time to generate a phase detection value and an energy estimation value, respectively. The energy detection value indicates the energy of the input signal at the detecting time. The phase detection value and the energy estimation value are both inputted into the selecting circuit 330, which determines whether to output the phase detection value detected at the detecting time by the phase detecting circuit 310 according to the energy estimation value.

It is to be noted that the invention does not limit the detection method adopted by the phase detecting circuit 310 and the energy estimating circuit 320. Any algorithms capable of detecting phase and energy can be applied in the invention. For example, the energy estimation value may be a sum of squares of components of an in-phase channel or a quadrature channel, or the amplitude of the input signal. Additionally, the selecting circuit 330 can be implemented by a multiplexer.

Figure 4:
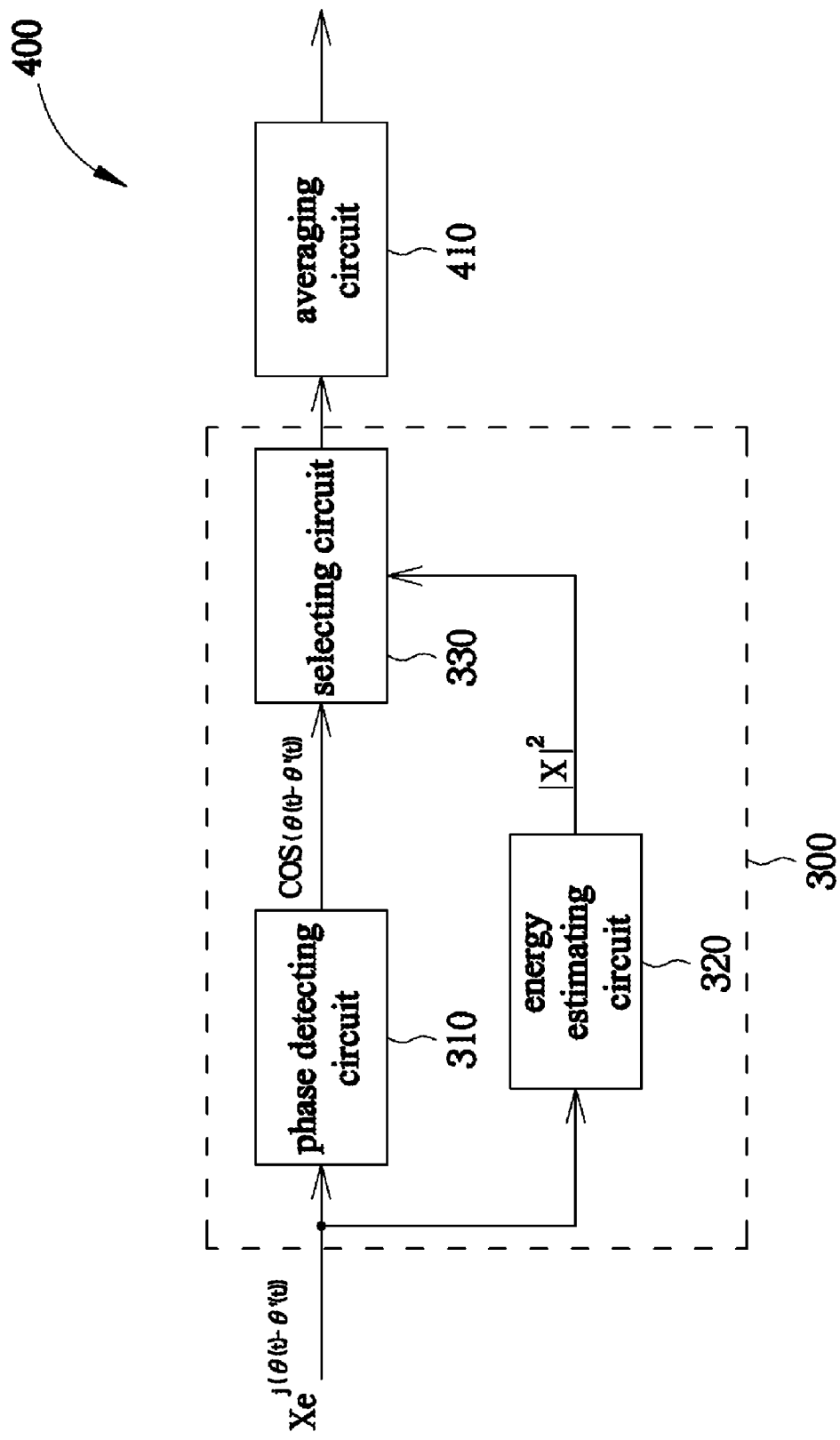
FIG. 4 is a block diagram of the phase detecting module in FIG. 3 implemented to a phase lock indicator according to one embodiment of the invention.

FIG. 4 is a diagram showing a structure of the phase detecting module 300 being applied to a phase lock indicator. A signal input into the phase detecting module 300 is an operational result $Xe^{j(\Theta(t)-\Theta'(t))}$ of an input signal $Xe^{-j\Theta'(t)}$ generated by the PLL (not shown) and a reference signal $Xe^{-j\Theta(t)}$ to be locked to. Therefore, the phase detection value detected by the detecting circuit 310 is the phase difference $\Theta(t)-\Theta'(t)$ between the output signal of the PLL and the reference signal. In one embodiment, the output of the phase detecting circuit 310 corresponds to a value of the phase difference, e.g., $\cos(\partial(t)-\partial'(t))$. Upon estimation of the energy $|X|^2$ by the energy estimating circuit 320, the selecting circuit 330 outputs the phase detection value $\cos(\partial(t)-\partial'(t))$ to a subsequent operational circuit when the energy estimated value $|X|^2$ is greater than a predetermined threshold. The reason for doing so is to eliminate phase detection results of signals that have inadequately low SNR and are prone to noise interference, so as to avoid misjudging of the phase indicator caused by distorted phases and further undesirably affecting performance of the PLL. To be more specific, when a communication system needs low-energy signals for detection or other processing, the selecting circuit 300 may be altered to output the phase detection value when the energy estimation value is smaller than a predetermined threshold. In this embodiment, the predetermined threshold of the selecting circuit 330 is associated with the bandwidth of the low-pass filter in the PLL and the constellation used for modulation.

After undergoing operational processing, the phase detection value having a certain degree of reliability may be used to indicate whether the PLL is locked to the frequency of the reference signal. In this embodiment, an averaging circuit 410 calculates an average of the phase detection values outputted from the phase detecting module 300. The smaller the phase difference $\Theta(t)-\Theta'(t)$ gets, the closer the phase detecting value $\cos(\partial(t)-\partial'(t))$ approaches 1. Therefore, when the average calculated by the averaging circuit 410 approaches 1, it means that the PLL is locked to the frequency of the reference signal, and a phase lock indicator 400 may then control the low-pass filter in the PLL to change the bandwidth. Apart from calculating the average of the phase detection value from the phase detecting module 300, the averaging circuit 410 may also calculate expected ideal phase detection values or adds up products of individual phase detection values and corresponding weight values to accomplish similar effects. The invention does not limit algorithms to be adopted by the averaging circuit 410 as long as distribution or sizes of the phase detection value are obtained.

Figure 5:
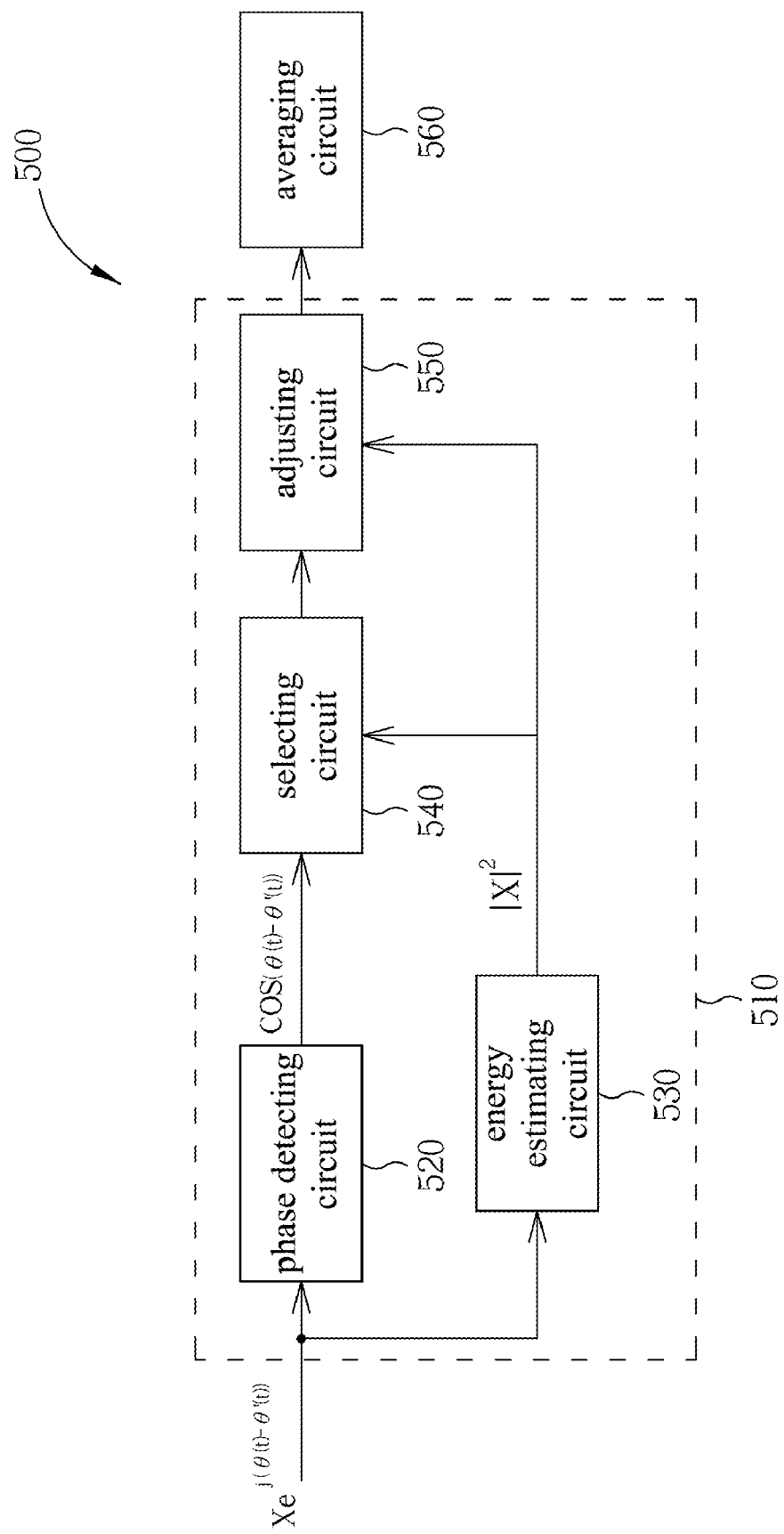
FIG. 5 is a schematic diagram of the phase detecting module implemented to a phase lock indicator according to another embodiment of the invention.
Figure 6:
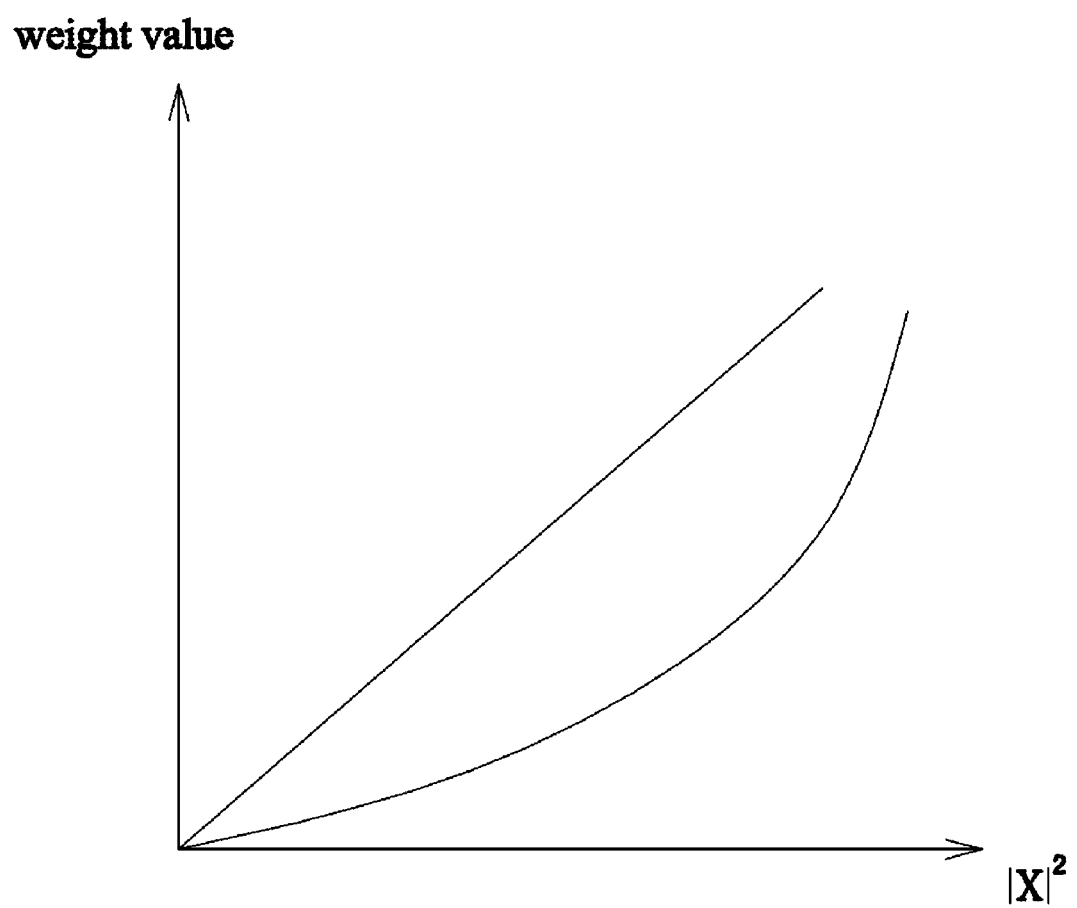
FIG. 6 is a schematic diagram showing correlations between an energy value of an energy estimating circuit and a predetermined weight value of an adjusting circuit.

FIG. 5 shows a phase lock indicator according to another embodiment of the invention. A phase detecting module 510 further comprises an adjusting circuit 550. The adjusting circuit 550 determines a weight value according to the energy estimation value $|X|^2$, and multiplies the phase detection value $\cos(\partial(t)-\partial'(t))$ outputted from the selecting circuit 540 with the weight value, so as to adjust the weight of the phase detection value during the phase lock indicator determines a lock status of the PLL. Referring to FIG. 6, the weight value and the energy estimation value $|X|^2$ may have a linear or non-linear relationship. However, generally speaking, the greater the energy of the input signal is, that is, the greater the energy estimation value $|X|^2$ gets, the larger the selected weight value is, so as to optimize detection accuracy and noise robustness. Hence, when the energy estimation value $|X|^2$ equals to a first value, a weight value set by the adjusting circuit 550 equals to a second value; when the energy estimation value $|X|^2$ equals to a third value that is smaller than the first value, the weight value set by the adjusting circuit 550 is smaller than the second value.

Figure 7:
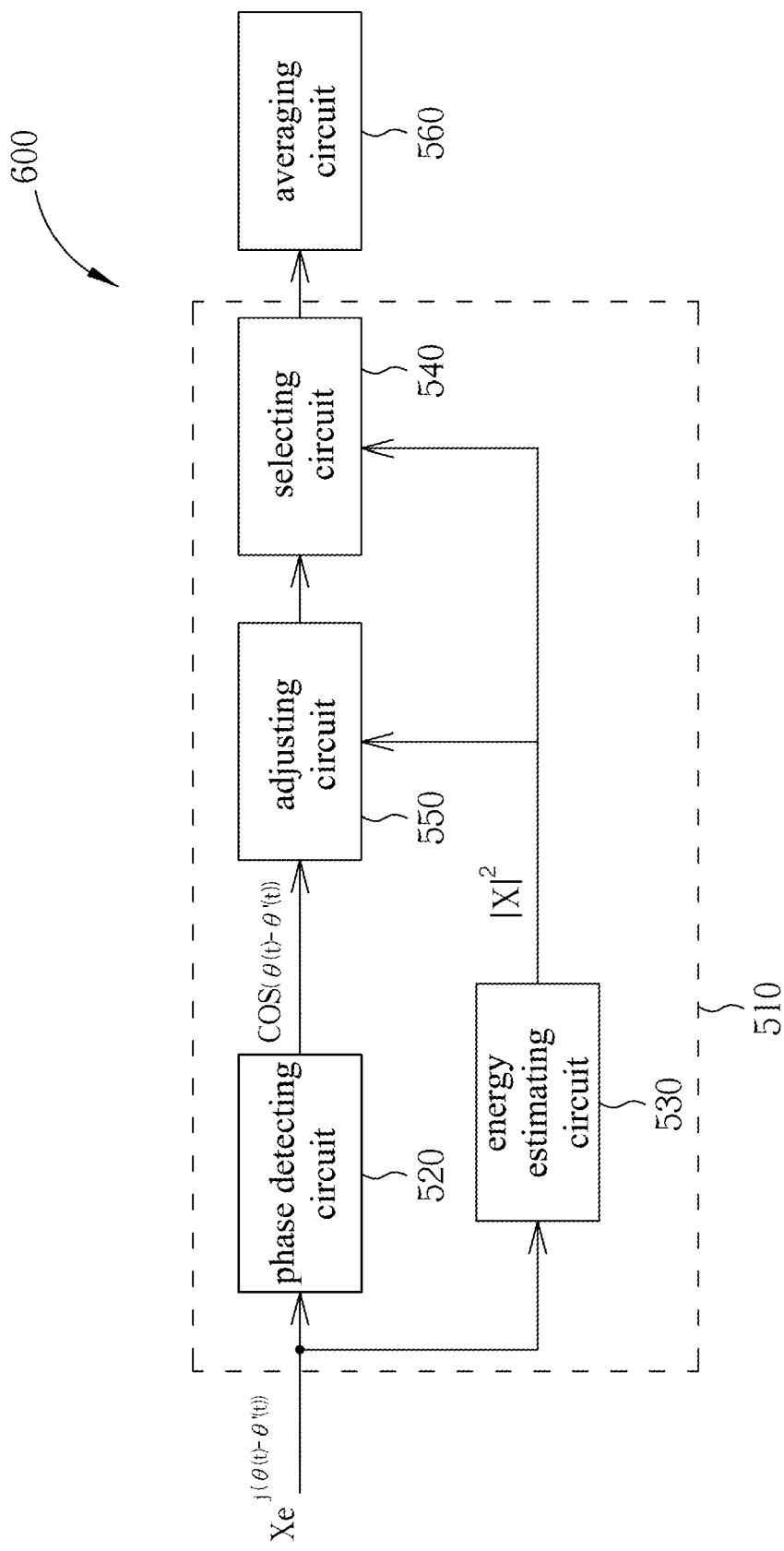
FIG. 7 is a schematic diagram of the phase detecting module implemented to a phase lock indicator according to another embodiment of the invention.

According to another embodiment, as shown in the FIG. 7, the adjusting circuit 550 is coupled to an input end of the selecting circuit 540, and receives the energy estimation value from the estimating circuit 530 to determine a weight value. At this point, the adjusting circuit 550 multiplies the phase detection value detected by the phase detecting circuit 520 with the weight value to adjust the phase detection value to be inputted to the selecting circuit 540. The selecting circuit 540 then compares the adjusted phase detection value with a threshold to determine whether to output the adjusted phase detection value to the averaging circuit 560.

The phase detecting module can be provided without the selecting circuit, but uses the adjusting circuit to adjust each phase detection value according to the energy estimation value. Therefore, in this embodiment, all the phase detection values are inputted into the averaging circuit for calculation, with the phase detection values calculated in different weights, however. In another embodiment, when the energy estimation value is smaller than a threshold, the adjusting circuit sets the weight value to zero to eliminate phase detection results of signals that have inadequately low SNR and are prone to noise interference. These design modifications are all capable of achieving the objective of optimizing detection accuracy and noise robustness.

It is to be noted that, the phase detecting modules in the above embodiments optimize detection accuracy by either eliminating detection results of signals having inadequately low SNR, or reducing weights of these detection results. Therefore, processing methods on outputs from the phase detecting modules are for illustrating purposes but not to limit the invention within.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A phase detecting module, comprising:
    a phase detecting circuit, for detecting a phase of an input signal to generate a phase detection value;
    an energy estimating circuit, for estimating energy of the input signal to generate an energy estimation value;
    a selecting circuit, coupled to the energy estimating circuit and the phase detecting circuit, for selectively outputting the phase detection value according to the energy estimation value, and
    an adjusting circuit, determining a weight value according to the energy estimation value, and adjusting the phase detection value outputted by the selecting circuit according to the weight value.

2. The phase detecting module as claimed in claim 1, wherein as the energy estimation value increases, the weight value increases.

3. The phase detecting module as claimed in claim 1, wherein the adjusting circuit adjusts the phase detection value by multiplying with the weight value.

4. The phase detecting module as claimed in claim 1, wherein the selecting circuit outputs the phase detection value when the energy estimation value is greater than a threshold.

5. The phase detecting module as claimed in claim 1, wherein the input signal is an operational result of an output signal generated by a phase-locked loop (PLL) and a reference signal to be locked to.

6. A phase detecting module, comprising:
    a phase detecting circuit, for detecting a phase of an input signal to generate a phase detection value;
    an energy estimating circuit, for estimating energy of the input signal to generate an energy estimation value;
    an adjusting circuit, for determining a weight value according to the energy estimation value, and adjusting the phase detection value according to the weight value, and
    a selecting circuit, receiving the adjusted phase detection value outputted by the adjusting circuit, and selectively outputting the adjusted phase detection value according to the energy estimation value.

7. The phase detecting module as claimed in claim 6, wherein as the energy estimation value increases, the weight value increases.

8. The phase detecting module as claimed in claim 6, wherein the adjusting circuit adjusts the phase detection value by multiplying with the weight value.

9. The phase detecting module as claimed in claim 6, wherein when the energy estimation value is smaller than a threshold, the adjusting circuit sets the weight value to zero.

10. The phase detecting module as claimed in claim 6, wherein the input signal is an operational result of an output signal generated by a PLL and a reference signal to be locked to.

11. A phase detecting method, comprising steps of:
    detecting a phase of an input signal to generate a phase detection value;
    estimating energy of the input signal to generate an energy estimation value;
    determining a weight value according to the energy estimation value, and adjusting the phase detection value according to the weight value; and
    selectively outputting the phase detection value according to the energy estimation value.

12. The phase detecting method as claimed in claim 11, wherein the step of determining a weight value is before the step of selectively outputting the phase detection value according to the energy estimation value.

13. The phase detecting method as claimed in claim 11, wherein as the energy estimation value increases, the weight value increases.

14. The phase detecting method as claimed in claim 11, wherein the step of determining a weight value is after the step of selectively outputting the phase detection value according to the energy estimation value.

15. The phase detecting method as claimed in claim 14, wherein as the energy estimation value increases, the weight value increases.

16. The phase detecting method as claimed in claim 11, wherein the step of selectively outputting the phase detection value according to the energy estimation value comprises outputting the phase detection value when the energy estimation value is greater than a threshold.

17. The phase detecting method as claimed in claim 11, wherein the input signal is an operational result of an output signal generated by a PLL and a reference signal to be locked to.

* * * * *